(12) United States Patent
Wang et al.

(10) Patent No.: US 12,394,752 B2
(45) Date of Patent: *Aug. 19, 2025

(54) MULTI-CHIP DEVICE AND METHOD OF FORMATION

(71) Applicant: Taiwan Semiconductor Manufacturing Company Limited, Hsin-Chu (TW)

(72) Inventors: Chin-Hua Wang, New Taipei (TW); Po-Chen Lai, Hsinchu County (TW); Shu-Shen Yeh, Taoyuan (TW); Tsung-Yen Lee, Hemei Township (TW); Po-Yao Lin, Zhudong Township (TW); Shin-Puu Jeng, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/641,643

(22) Filed: Apr. 22, 2024

(65) Prior Publication Data

US 2024/0274577 A1    Aug. 15, 2024

Related U.S. Application Data

(63) Continuation of application No. 18/138,201, filed on Apr. 24, 2023, now Pat. No. 11,967,582, which is a continuation of application No. 17/458,702, filed on Aug. 27, 2021, now Pat. No. 11,637,087.

(51) Int. Cl.
| | |
|---|---|
| *H01L 25/065* | (2023.01) |
| *H01L 23/373* | (2006.01) |
| *H01L 23/498* | (2006.01) |
| *H01L 25/00* | (2006.01) |

(52) U.S. Cl.
CPC ...... *H01L 25/0655* (2013.01); *H01L 23/3731* (2013.01); *H01L 23/49822* (2013.01); *H01L 25/50* (2013.01)

(58) Field of Classification Search
None
See application file for complete search history.

(56) References Cited

U.S. PATENT DOCUMENTS 11,637,087 B2 * 4/2023 Wang ............... H01L 25/50
                                                257/668
11,967,582 B2 * 4/2024 Wang ............... H01L 25/50

* cited by examiner

*Primary Examiner* — Michael Lebentritt
(74) *Attorney, Agent, or Firm* — Cooper Legal Group, LLC

(57) ABSTRACT

A multi-chip device includes a first material within a substrate. The first material has a first coefficient of thermal expansion different than a second coefficient of thermal expansion of the substrate. A first chip overlies a first portion of the first material and a first portion of the substrate. A second chip overlies a second portion of the first material and a second portion of the substrate. The first material is between the first portion of the substrate and the second portion of the substrate.

20 Claims, 13 Drawing Sheets

MULTI-CHIP DEVICE AND METHOD OF FORMATION

CROSS-REFERENCE TO RELATED APPLICATION

This application is a continuation of and claims priority to U.S. patent application Ser. No. 18/138,201, titled "MULTI-CHIP DEVICE AND METHOD OF FORMATION" and filed on Apr. 24, 2023, which is a continuation of and claims priority to U.S. patent application Ser. No. 17/458,702, titled "MULTI-CHIP DEVICE AND METHOD OF FORMATION" and filed on Aug. 27, 2021. U.S. patent application Ser. No. 18/138,201 and U.S. patent application Ser. No. 17/458,702 are incorporated herein by reference.

BACKGROUND

Many consumer and commercial electronic devices include or are formed on printed circuit boards (PCBs). A PCB includes pads for connecting electronic components, such as integrated circuit chips, to the surface of the PCB. The electronic components are also coupled to PCB contact points. The PCB contact points are coupled to conductive traces within or on the PCB board and electrically couple different electronic components to one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
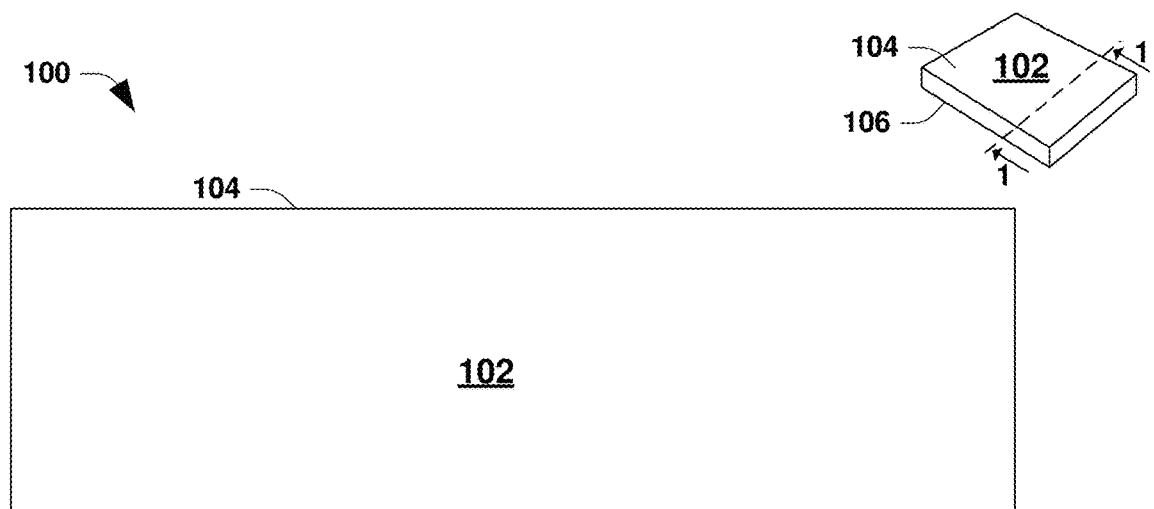
FIGS. 1-8 are cross-sectional views of a multi-chip device and/or semiconductor packaging structure at various stages of fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more apparatuses or methods for reducing the stress on conductive traces within a redistribution layer of a multi-chip device are provided herein. In some embodiments, the multi-chip device is a multi-chip fan-out device.

Reducing the stress on the conductive traces may be implemented by replacing a portion of a first material of a substrate having a first coefficient of thermal expansion with a second material having a second coefficient of thermal expansion, less than the first coefficient of thermal expansion. The first material is replaced by the second material in an area of the substrate that underlies conductive traces that underlie a gap between two chips of the multi-chip device. The second material reduces expansion and warpage of the substrate in the presence of a heat source compared to the expansion and warpage of the substrate of the first material in the presence of a heat source. By reducing expansion and warpage of the substrate in the presence of a heat source, stress on the conductive traces within the redistribution layer of the multi-chip device is reduced. Reducing stress on the conductive traces reduces the potential for cracks forming in and/or breakage of the conductive traces. Reducing the potential for cracks forming in and/or breakage of the conductive traces increases the reliability of the multi-chip device and improves the yield of multi-chip devices, including fan-out multi-chip devices.

According to some embodiments, a multi-chip device is formed by forming an opening in a substrate of a first material having a first coefficient of thermal expansion and filling the opening with a second material having a second coefficient of thermal expansion that is less than the first coefficient of thermal expansion. A contact layer is formed over the substrate and a redistribution layer is formed over the contact layer. The contact layer physically supports the redistribution layer over the substrate. The redistribution layer includes conductive traces that electrically couple to one another multiple chips mounted over the redistribution layer. The conductive traces underlie gaps between the mounted chips and are susceptible to cracking or breakage if, for example, the substrate expands in the presence of a heat source. The second material in the opening in the substrate reduces the degree of expansion of the substrate and thereby reduces the potential for cracks forming in the conductive traces and/or breakage of the conductive traces. In some embodiments, the width of a gap between two chips is less than the width of the second material in the opening in the substrate underlying the gap.

FIGS. 1-8 are cross-sectional views taken along line 1-1 of a multi-chip device 100 and/or semiconductor packaging structure at various states of fabrication, according to some embodiments.

Referring to FIG. 1, the multi-chip device 100 comprises a substrate 102 or is formed in and/or on the substrate 102. The substrate 102 may comprise at least one of a glass fiber reinforced epoxy resin, a fiberglass, a paper reinforced phenolic resin, a composite of non-conductive substrate materials, a laminate, a polyimide, or other suitable materials. The substrate 102 may comprise a single-sided, double-sided, or multi-layered printed circuit board comprising an upper surface 104 and a lower surface 106. In some embodiments, the substrate 102 comprises a copper foil bonded to at least one of the upper surface 104 or the lower surface 106. Other materials and/or configurations of the substrate 102 are within the scope of the present disclosure.

Figure 2:
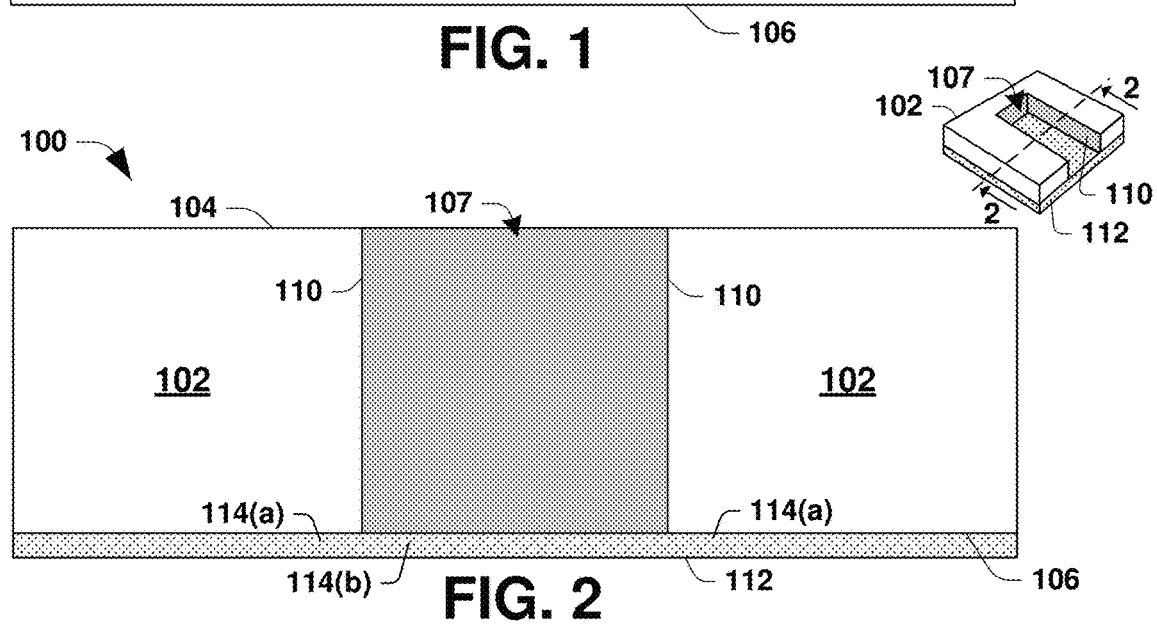

Referring to FIG. 2, the substrate 102 comprises side walls 110 defining an opening 107 in the substrate 102. The opening 107 may be formed by at least one of wet etching, dry etching, a mechanical process, or other suitable techniques. In some embodiments, the opening 107 is formed through the substrate 102, including through the upper surface 104 and the lower surface 106.

According to some embodiments, the opening 107 through the lower surface 106 is sealed by a covering 112. In some embodiments, the covering 112 is an adhesive tape having a first portion 114(a) adhered to the lower surface 106 and a second portion 114(b) underlying and sealing the opening 107. In some embodiments, the covering 112 comprises at least one of tape lamination, an industrial grade tape, an electronic grade tape, or other suitable tape. Other configurations of the opening 107 and the covering 112 are within the scope of the present disclosure.

Figure 3:
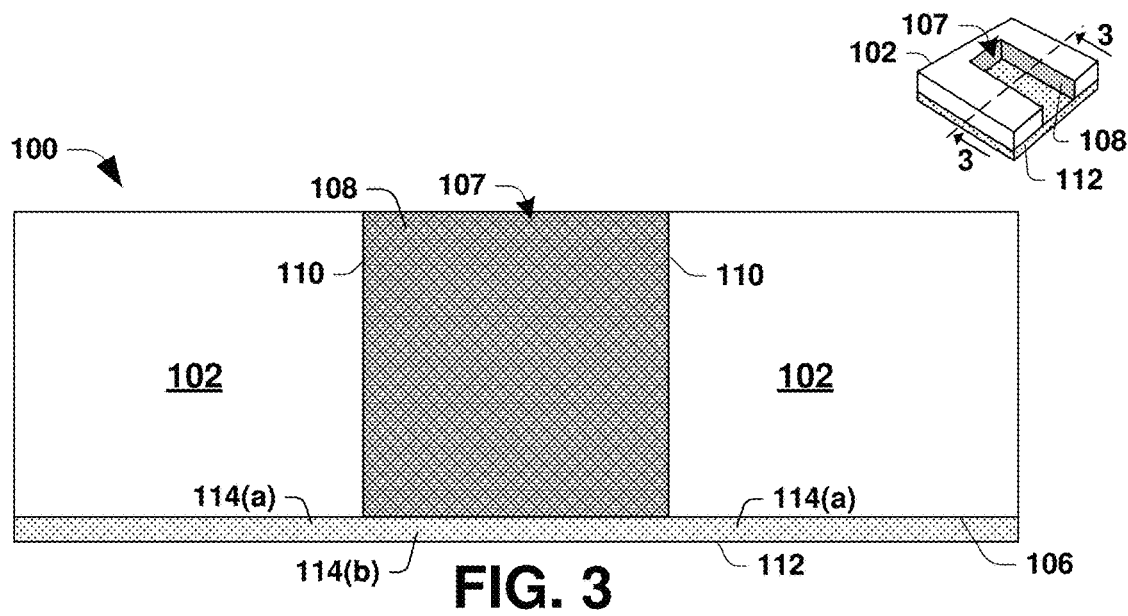

Referring to FIG. 3, in some embodiments the multi-chip device 100 comprises a layer or layers of an adhesive material 108 over the side walls 110. According to some embodiments, the adhesive material 108 comprises at least one of a tungsten (W) layer, a tantalum oxide (TaO) layer, a titanium (Ti) layer, a titanium oxide (TiO) layer, a titanium nitride (TiN) layer, an organic material, an inorganic material, an epoxy resin, or a layer or layers of other suitable materials. According to some embodiments, the adhesive material 108 may be applied to the side walls 110 by at least one of thin-film deposition, atomic layer deposition, molecular layer deposition, chemical vapor deposition, physical vapor deposition, plasma enhanced chemical vapor deposition, sputtering, or other suitable techniques.

Figure 4:
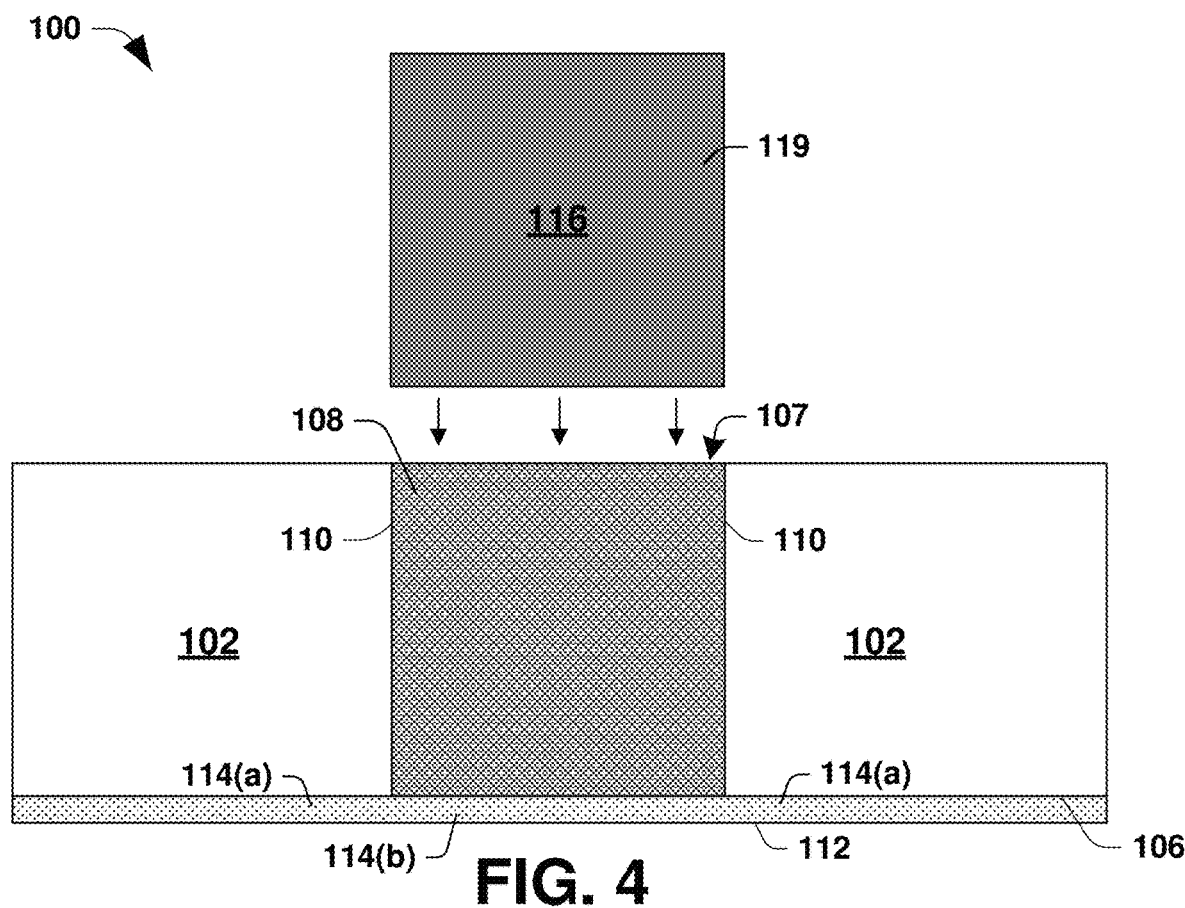
Figure 5:
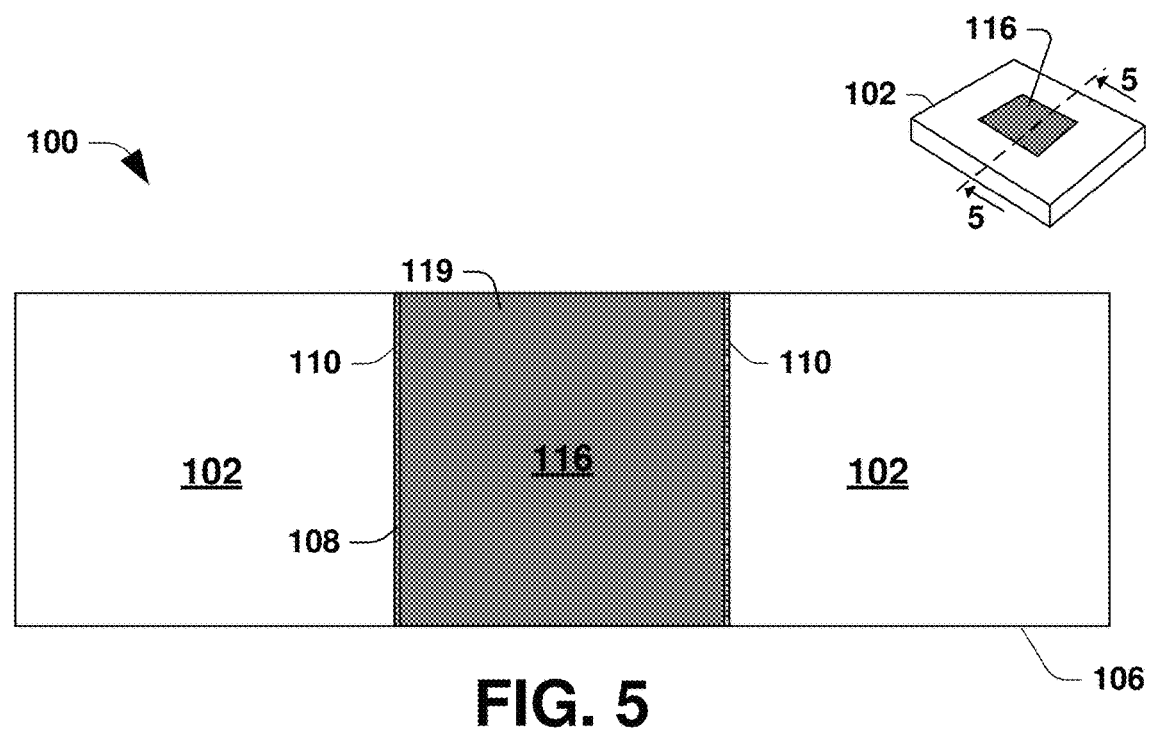

FIG. 4 and FIG. 5 illustrate the multi-chip device 100 during intermediate stages of fabrication, according to some embodiments. The multi-chip device 100 comprises a plug 116 in the opening 107 formed in the substrate 102. The plug 116 may be pre-formed to dimensions that correspond to dimensions of the opening 107 and inserted into the opening 107, according to some embodiments. The plug 116 may be inserted into the opening 107 by at least one of laser-guided machinery (not shown) or other suitable devices.

According to some embodiments, the plug 116 is formed of a material 119 that has a coefficient of thermal expansion (CTE) that is different than a CTE of the material of the substrate 102. According to some embodiments, the plug 116 is formed of a material 119 that has a CTE that is less than a CTE of the material of the substrate 102. The CTE of the material 119 of the plug 116 may be less than or equal to one-half the CTE of the material of the substrate 102. For example, if the CTE of the material of the substrate 102 is within a range of 7-12 parts-per-million per degree Celsius, the CTE of the material 119 of the plug 116 may be within a range that is less than or equal to 3.5-12 parts-per-million per degree Celsius. The material 119 of the plug 116 may comprise at least one of silica, a ceramic, or other suitable materials. The plug 116 may be formed by at least one of slip-casting, hydraulic casting, additive manufacturing, shell casting, dry pressing, injection moulding, hot wax moulding, tape casting, deposition, growth (e.g., with or without a seed layer), or other suitable techniques (e.g., with or without the adhesive material 108).

Heat, radiation, electron beams, or chemical additives may be applied to the adhesive material 108 to initiate curing. The covering 112 may be removed at least one of as or after the adhesive material 108 is curing or has cured. Other techniques for forming the plug 116 in the substrate 102 are within the scope of the present disclosure.

Figure 6:
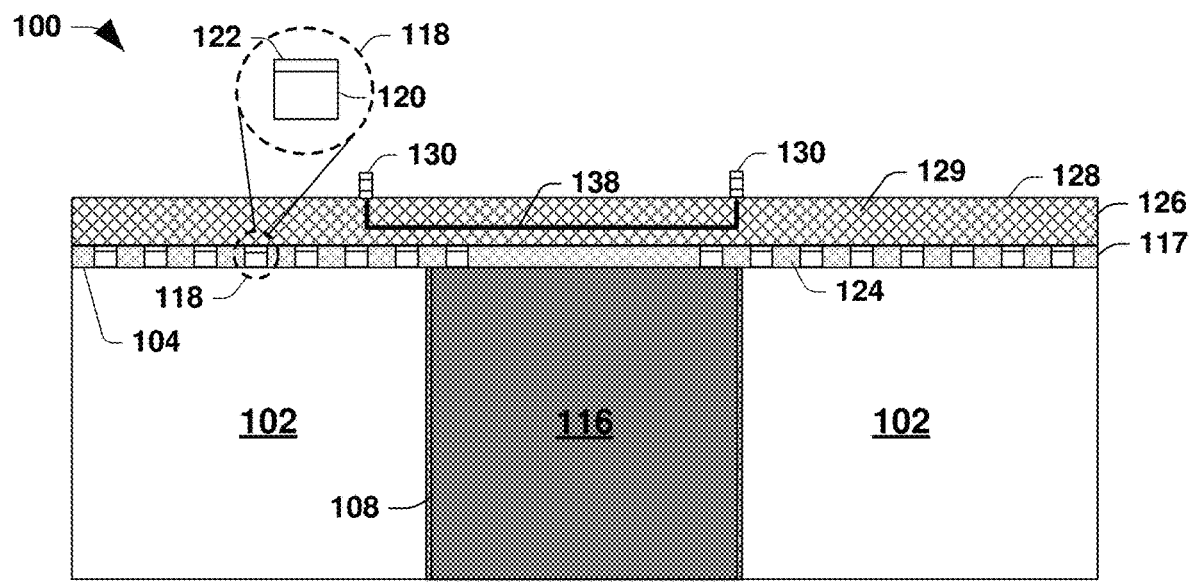

Referring to FIG. 6, the multi-chip device 100 comprises a contact layer 117 comprising a contact 118 coupled to at least one of the substrate 102 or the plug 116, according to some embodiments. The contact 118 may comprise a pad 122 coupled to a solder bump 120. The pad 122 may be coupled to a redistribution layer 126 and the solder bump 120 may be coupled to at least one of the substrate 102 or the plug 116. The contact layer 117 may comprise an underfill material 124. According to some embodiments, the underfill material 124 comprises a composite material comprising an epoxy polymer and a filler material. The underfill material 124 may comprise at least one of flow agents, adhesion promotors, dyes, or other suitable materials. Other configurations of the contact layer 117 are within the scope of the present disclosure.

According to some embodiments, the contact 118 overlies at least one of the substrate 102 or the plug 116 and underlies the redistribution layer 126. The redistribution layer 126 may comprise a metal layer comprising at least one conductive trace 138 within the redistribution layer 126. The conductive trace 138 is electrically coupled to chip contacts 130 overlying an upper surface 128 of the redistribution layer 126. The conductive trace 138 may comprise at least one of copper or other suitable materials. The conductive trace 138 may be formed by etching openings into the redistribution layer 126 and filling the openings with one or more conductive materials, such as by flowing the conductive materials into the openings. The redistribution layer 126 may comprise a dielectric material 129 as electrical insulation between conductive traces 138. In some embodiments, the dielectric material 129 comprises at least one of an epoxy, a polymer, a glass epoxy, a phenolic resin compound, or other suitable materials. Other configurations of the redistribution layer and/or conductive traces are within the scope of the present disclosure.

Figure 7:
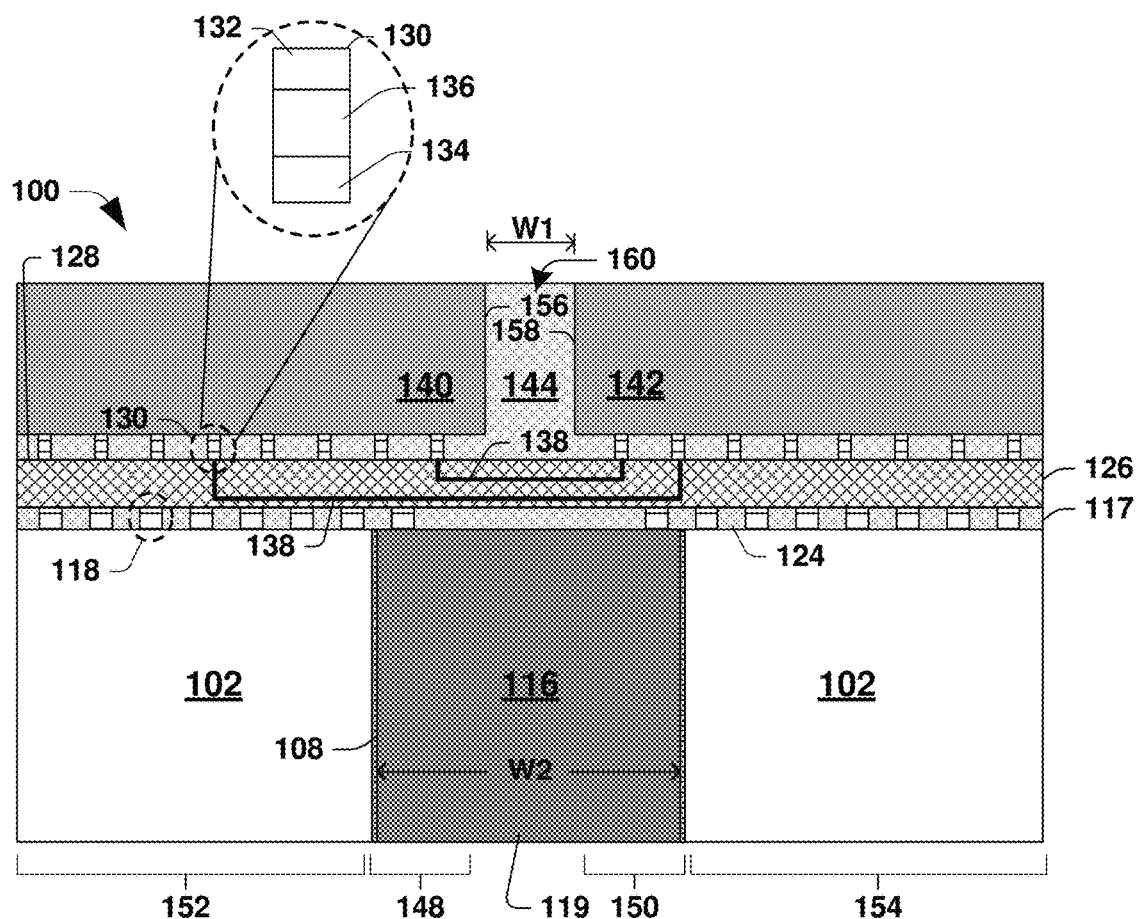

Referring to FIG. 7, the multi-chip device 100 comprises a first chip 140 and a second chip 142 overlying the chip contacts 130. The redistribution layer 126 may underlie the first chip 140 and the second chip 142 and overlie the material 119. The first chip 140 and the second chip 142 are coupled to the chip contacts 130, and the chip contacts 130 are coupled to the conductive trace 138. Thus, according to some embodiments the first chip 140 is electrically coupled to the second chip 142 by way of the chip contacts 130 and the conductive trace 138. Other configurations of the redistribution layer 126 for electrically coupling the first chip 140 to the second chip 142 are within the scope of the present disclosure. More chips than the first chip 140 and the second chip 142 are within the scope of the present disclosure.

In some embodiments, a chip contact of the chip contacts 130 comprises a first contact pad 132 electrically coupled to the first chip 140 or the second chip 142, a second contact pad 134 electrically coupled to the conductive trace 138, and a conductor 136 electrically coupled to the first contact pad 132 and the second contact pad 134. According to some embodiments, the conductor 136 is a solder ball. Other configurations of chip contacts 130 are within the scope of the present disclosure.

The first chip 140 comprises a first surface 156 and the second chip 142 comprises a second surface 158, opposite the first surface 156. The first surface 156 and the second surface 158 are separated by a gap 160 which vertically overlies the material 119. A width W1 of the gap 160 is less than or equal to a width W2 of the material 119, such that W1 and W2 are defined as "W1≤W2." In some embodiments, a width of the gap 160 is less than or equal to approximately one millimeter. A portion of the conductive trace 138 underlies the gap 160 and vertically overlies the material 119.

In some embodiments, the first chip 140 vertically overlies a first portion 148 of the material 119 and a first portion 152 of the substrate 102, and the second chip 142 vertically overlies a second portion 150 of the material 119 and a second portion 154 of the substrate 102. In some embodiments, the multi-chip device 100 comprises underfill 144 at least one of within the gap 160, between the redistribution layer 126 and the first chip 140, or between the redistribution layer 126 and the second chip 142. According to some embodiments, the underfill 144 comprises at least one of a polymer, an epoxy, or other suitable materials.

Figure 8:
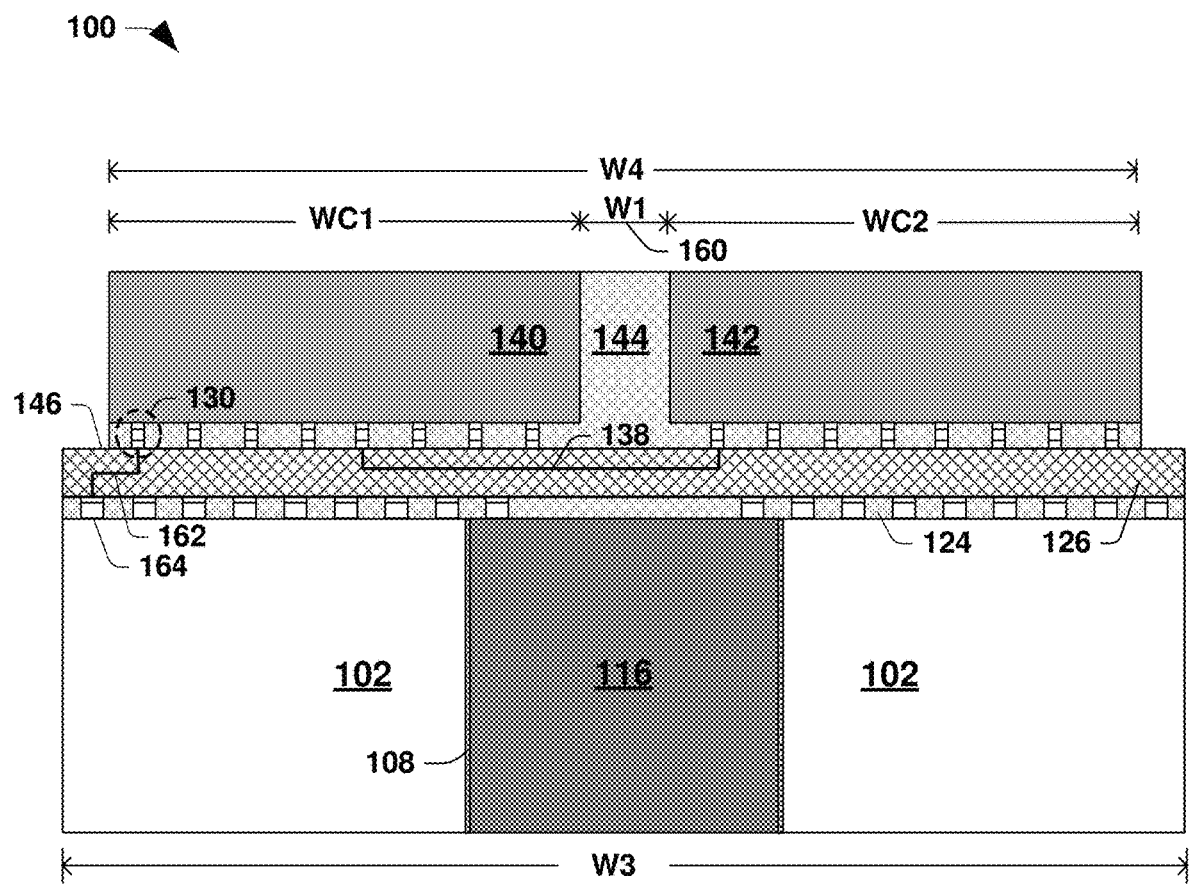

Referring to FIG. 8, according to some embodiments the redistribution layer 126 comprises a fan-out redistribution layer 146. The fan-out redistribution layer 146 has a width W3 greater than a width W4 of the combined widths of the first chip 140 (WC1), the gap 160 (W1), and the second chip 142 (WC2). The fan-out redistribution layer 146 comprises a fan-out conductive trace 162 electrically coupled to a chip contact 130 and a fan-out contact 164. The fan-out contact 164 underlies a portion of the fan-out redistribution layer 146 outside of the combined width W4. Other configurations of the fan-out redistribution layer 146 are within the scope of the present disclosure.

FIGS. 9-23 are cross-sectional views of a multi-chip device 900 and/or semiconductor packaging structure at various stages of fabrication, according to some embodiments. Features of the multi-chip device 100 and the various stages of fabrication of the multi-chip device 100 as described above are within the scope of features of the multi-chip device 900 and the various stages of fabrication of the multi-chip device 900 described herein. Features of the multi-chip device 900 and the various stages of fabrication of the multi-chip device 900 as described below are within the scope of features of the multi-chip device 100 and the various stages of fabrication of the multi-chip device 100 described herein.

Figure 9:
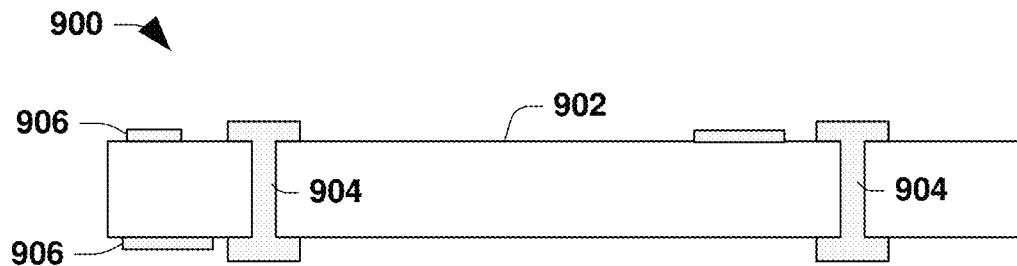
FIGS. 9-23 are cross-sectional views of a multi-chip device and/or semiconductor packaging structure at various stages of fabrication, according to some embodiments.

Referring to FIG. 9, according to some embodiments the multi-chip device 900 comprises a substrate 902 or is formed in and/or on the substrate 902. The substrate 902 may comprise at least one of a glass fiber reinforced epoxy resin, a fiberglass, a paper reinforced phenolic resin, a composite of non-conductive substrate materials, a laminate, a polyimide, or other suitable materials. The substrate 902 may comprise a single-sided, double-sided, or multi-layered printed circuit board. Other materials and/or configurations of the substrate 902 are within the scope of the present disclosure.

According to some embodiments, the multi-chip device 900 comprises one or more vertical interconnect accesses (VIAs) 904 formed in through-holes formed in the substrate 902 and one or more metal layers 906 formed on the substrate 902. At least some of the one or more VIAs 904 and/or at least some of the one or more metal layers 906 may be formed by at least one of lithography, etching, physical vapor deposition (PVD), sputtering, chemical vapor deposition (CVD), low pressure CVD (LPCVD), atomic layer deposition (ALD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), spin on, growth, a dual damascene process, or other suitable techniques.

Figure 10:
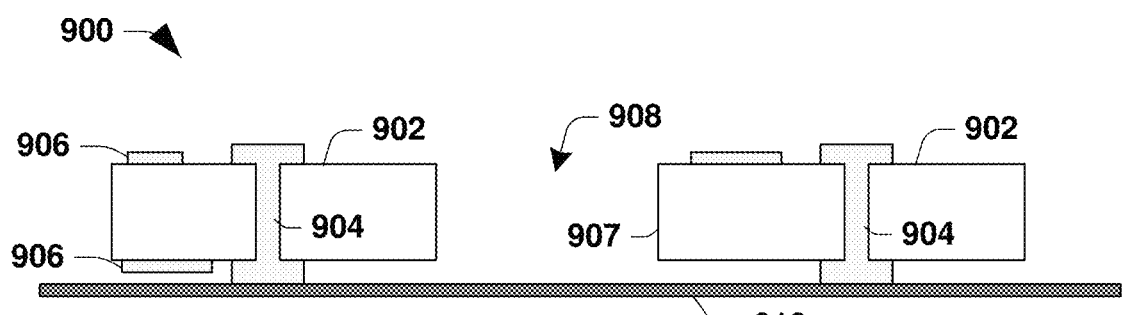

Referring to FIG. 10, the substrate 902 comprises side walls 907 defining an opening 908 in the substrate 902. The opening 908 may be formed by at least one of wet etching, dry etching, a mechanical process, or other suitable techniques. In some embodiments, the opening 908 is formed through the substrate 902 to the covering 910.

According to some embodiments, the opening 908 is sealed by a covering 910. The covering 910 may be an adhesive tape adhered to at least one of the substrate 902 or a metal layer of the one or more metal layers 906. In some embodiments, the covering 910 comprises at least one of tape lamination, an industrial grade tape, an electronic grade tape, or other suitable tape. Other configurations of the opening 908 and the covering 910 are within the scope of the present disclosure.

Figure 11:
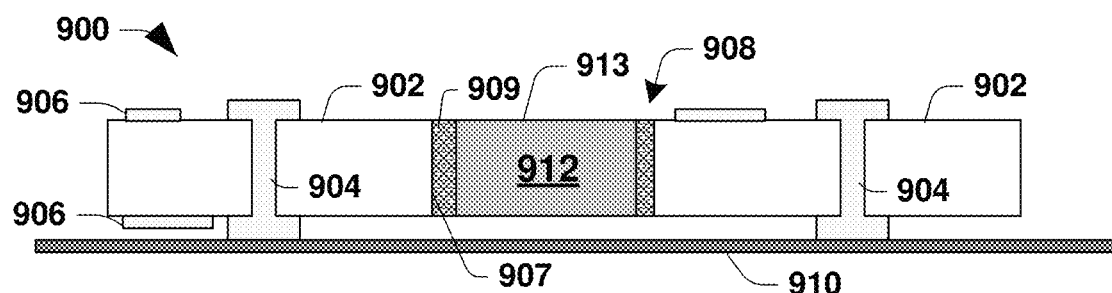

Referring to FIG. 11, the multi-chip device 900 comprises a plug 912 in the opening 908. According to some embodiments, the plug 912 is formed of a material 913 that has a coefficient of thermal expansion (CTE) that is different than a CTE of a material of the substrate 902. According to some embodiments, the plug 912 is formed of a material 913 that has a CTE that is less than a CTE of the material of the substrate 902. The CTE of the material 913 of the plug 912 may be less than or equal to one-half the CTE of the material of the substrate 902. For example, if the CTE of the material of the substrate 902 is within a range of 7-12 parts-per-million per degree Celsius, the CTE of the material 913 of the plug 912 may be within a range that is less than or equal to 3.5-12 parts-per-million per degree Celsius. The material 913 of the plug 912 may comprise at least one of silica, a ceramic, or other suitable materials. The plug 912 may be formed by at least one of slip-casting, hydraulic casting, additive manufacturing, shell casting, dry pressing, injection moulding, hot wax moulding, tape casting, deposition, growth (e.g., with or without a seed layer), or other suitable techniques. In some embodiments, the multi-chip device 900 comprises an adhesive material 909 over the side walls 907. The plug 912 adheres to the side walls by way of the adhesive material 909. According to some embodiments, the adhesive material 909 may be applied to the side walls 907 by at least one of thin-film deposition, atomic layer deposition, molecular layer deposition, chemical vapor deposition, physical vapor deposition, plasma enhanced chemical vapor deposition, sputtering, or other suitable techniques. Heat, radiation, electron beams, and/or chemical additives may be applied to the adhesive material 909 to initiate curing. Other techniques for forming the plug 912 in the substrate 902 and/or adhering the plug 912 to the side walls 907 are within the scope of the present disclosure.

Figure 12:
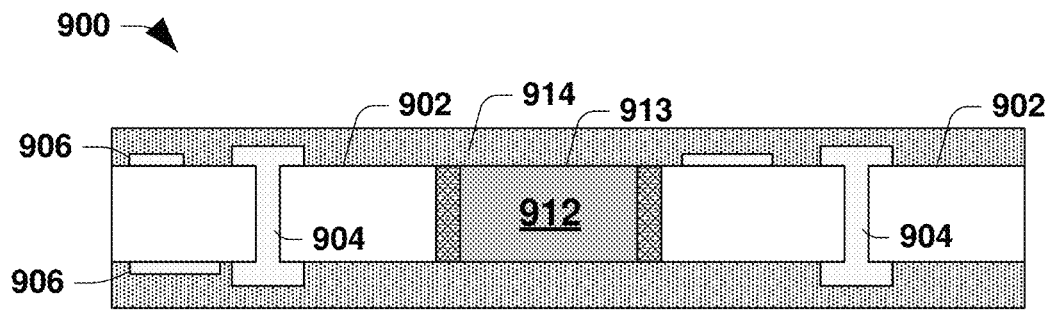

Referring to FIG. 12, the multi-chip device 900 comprises a dielectric material 914 over at least one of the substrate 902, one or more VIAs 904, one or more metal layers 906, or the plug 912. The dielectric material 914 may be formed by at least one of PVD, sputtering, CVD, LPCVD, ALCVD, UHVCVD, RPCVD, ALD, MBE, LPE, or other suitable techniques. The dielectric material 914 comprises at least one of a metal nitride, a high-k dielectric, a rare earth oxide, an aluminate of a rare earth oxide, a silicate of a rare earth oxide, or other suitable materials. According to some embodiments, the dielectric material 914 comprises at least one of silicon nitride (SiN), $Si_3N_4$, silicon dioxide ($SiO_2$), titanium dioxide ($TiO_2$), tantalum pentoxide ($Ta_2O_5$), zirconium dioxide ($ZrO_2$), yttrium oxide ($Y_2O_3$), hafnium dioxide ($HfO_2$), Ajinomoto build-up film (ABF), or other suitable materials. The covering 910 may be removed at least one of as or after the dielectric material 914 is formed.

Figure 13:
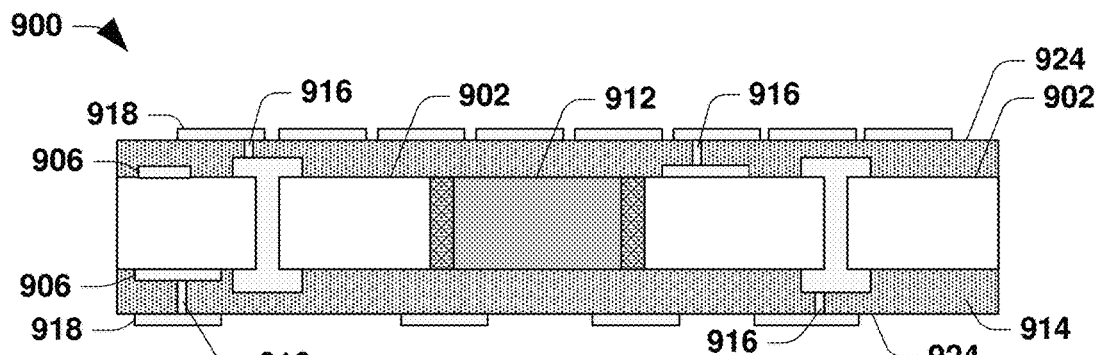

Referring to FIG. 13, the multi-chip device 900 comprises one or more VIAs 916 formed in the dielectric material 914, and one or more metal layers 918 formed on a surface 924 of the dielectric material 914. At least some of the one or more VIAs 916 and/or at least some of the one or more metal layers 918 may be formed by at least one of lithography, etching, PVD, sputtering, CVD, LPCVD, ALCVD, UHVCVD, RPCVD, ALD, MBE, LPE, spin on, growth, a dual damascene process, or other suitable techniques. Additional layers of dielectric material, additional metal layers, and/or additional VIAs may be formed over the dielectric material 914 and/or the one or more metal layers 918.

Figure 14:
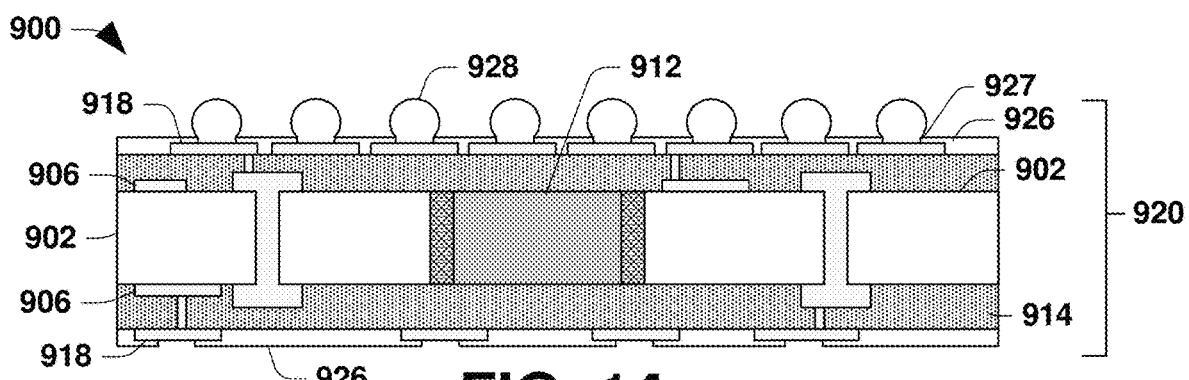

Referring to FIG. 14, one or more layers of resin 926 may be formed over the dielectric material 914 and/or the one or more metal layers 918. Side surfaces 927 of the one or more layers of resin 926 may define one or more solder openings for formation of solder structures 928 in the solder openings, such as over the one or more metal layers 918. Resin of the one or more layers of resin 926 may comprise cured epoxy resin and/or other suitable resin. The structure of the multi-chip device 900 illustrated in FIG. 14 may be referred to as a pre-solder formation 920.

Figure 15:
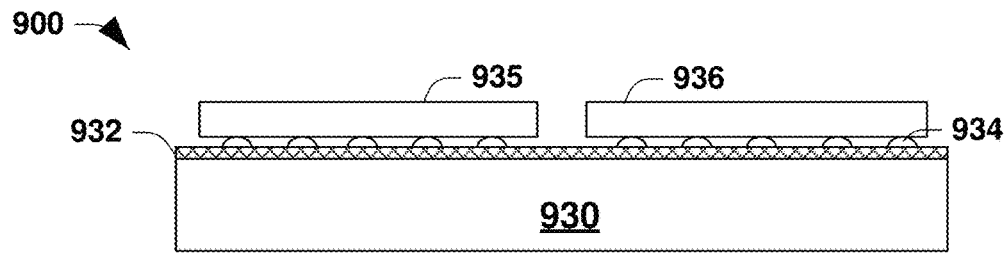

Referring to FIG. 15, according to some embodiments the multi-chip device 900 comprises a redistribution layer 932 formed over a first carrier wafer 930 comprising silicon and/or other suitable materials. The redistribution layer 932 may comprise a metal layer comprising at least one conductive trace within the redistribution layer 932. Chip contacts 934 are formed over the redistribution layer 932 and a first chip 935 and a second chip 936 of the multi-chip device 900 may be coupled to the redistribution layer 932 by way of the chip contacts 934. More chips than the first chip 935 and the second chip 936 are within the scope of the present disclosure.

Figure 16:
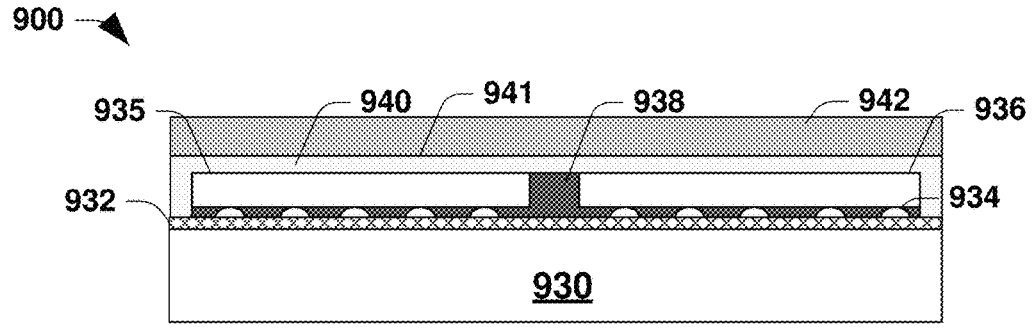

Referring to FIG. 16, according to some embodiments an underfill material 938 is formed between the first chip 935 and the second chip 936 and between the redistribution layer 932 and the first chip 935 and the second chip 936. The underfill material 938 may comprise a cured epoxy resin and/or other suitable materials. The underfill material 938 may reduce a degree of stress imposed on the chip contacts 934 by the first chip 935, the second chip 936, and/or the redistribution layer 932.

A composite material 940 may be formed over the first chip 935, the second chip 936, and the redistribution layer 932. According to some embodiments, the composite material 940 comprises a ceramic matrix composite and/or other suitable materials. A thickness of the composite material 940 may be reduced by grinding an upper surface 941 of the composite material 940 and/or by other suitable techniques. A second carrier wafer 942 comprising silicon and/or other suitable materials may be bonded to the upper surface 941 of the composite material 940.

Figure 17:
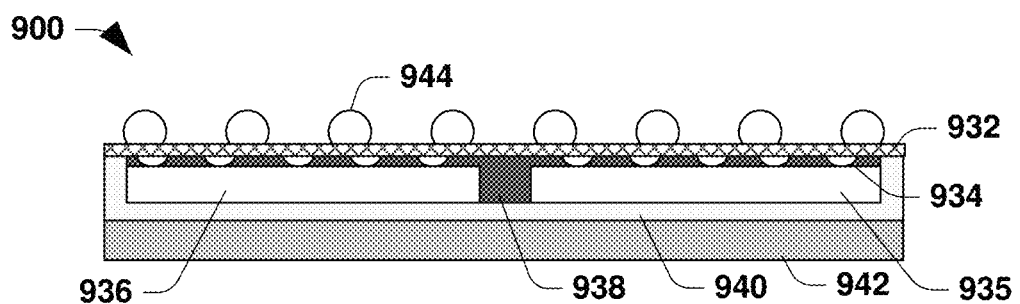

Referring to FIG. 17, the first carrier wafer 930 is de-bonded from the redistribution layer 932 and the multi-chip device 900 is flipped or rotated 180° such that the redistribution layer 932 is over the second carrier wafer 942. Solder bumps 944 are formed over the redistribution layer 932. According to some embodiments, the solder bumps 944 are controlled collapse chip connection solder bumps and/or other suitable bumps.

Figure 18:
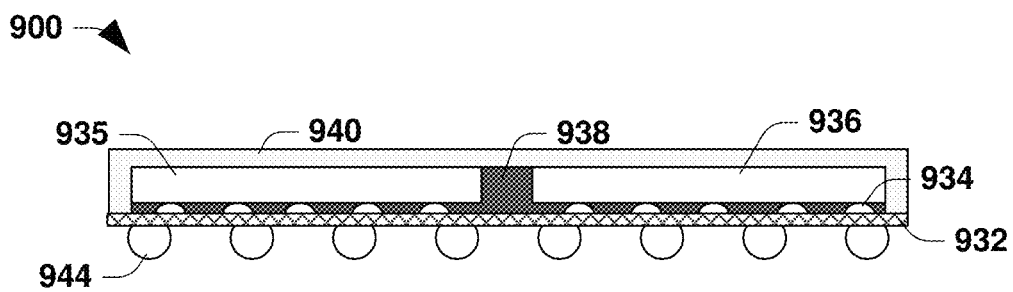

Referring to FIG. 18, the multi-chip device 900 is again flipped or rotated 180° such that the redistribution layer 932 is over the solder bumps 944. The second carrier wafer 942 is de-bonded from the composite material 940.

Figure 19:
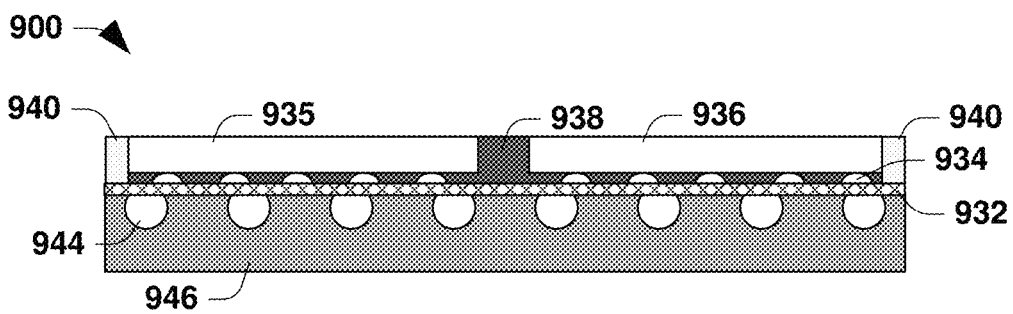

Referring to FIG. 19, according to some embodiments the thickness of the composite material 940 is further reduced by grinding or other suitable techniques, such as to reveal or expose the first chip 935 and/or the second chip 936. The solder bumps 944 and the redistribution layer 932 are covered by a tape laminate 946 and/or other suitable laminate.

Figure 20:
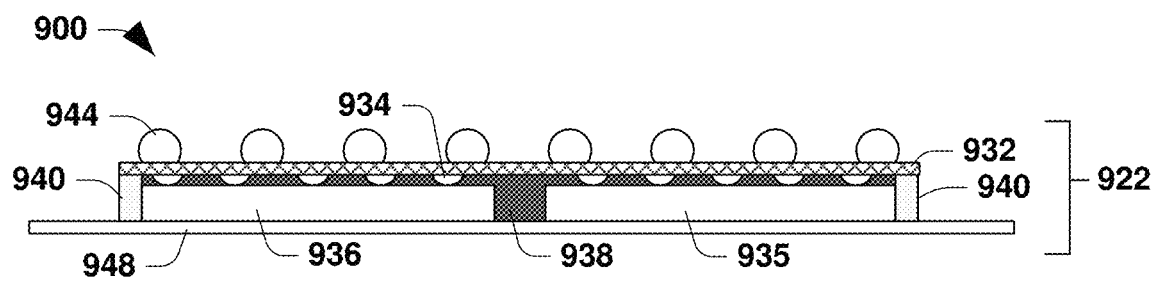

Referring to FIG. 20, the multi-chip device 900 is yet again flipped or rotated 180°, mounted on a frame 948, and the tape laminate 946 is removed. The structure of the multi-chip device 900 illustrated in FIG. 20 may be referred to as an interposer package 922.

Figure 21:
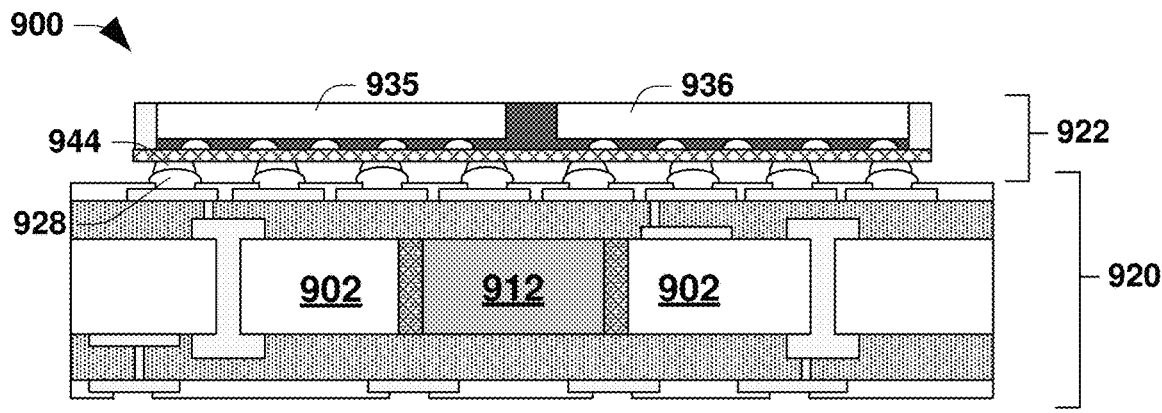

Referring to FIG. 21, the solder bumps 944 of the interposer package 922 and the solder structures 928 of the pre-solder formation 920 are joined together by applying heat, radiation, pressure, and/or other suitable energy to the multi-chip device 900.

Figure 22:
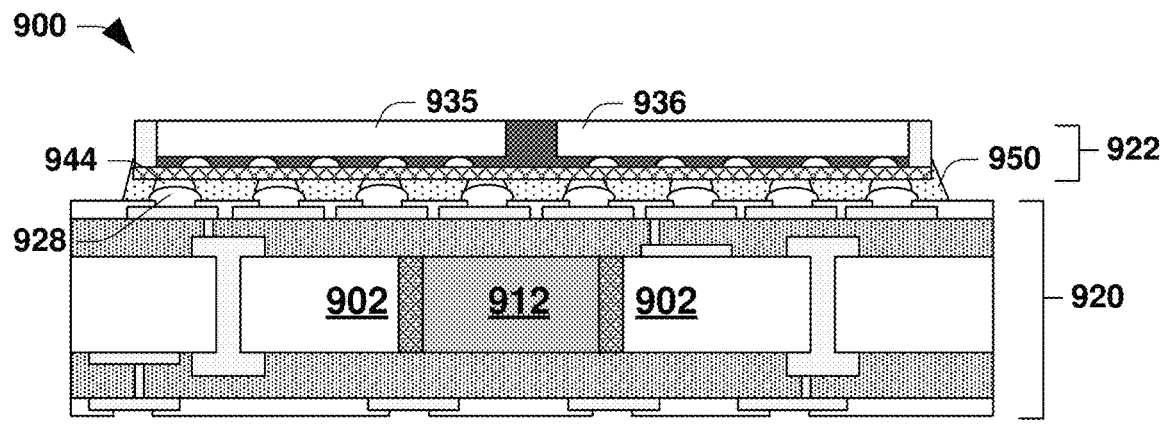

Referring to FIG. 22, according to some embodiments an underfill material 950 is formed between the interposer package 922 and the pre-solder formation 920. The underfill material 950 may comprise a cured epoxy resin and/or other suitable materials. The underfill material 950 may reduce a degree of stress imposed on the solder bumps 944 and/or the solder structures 928 by the interposer package 922 and/or the pre-solder formation 920.

Figure 23:
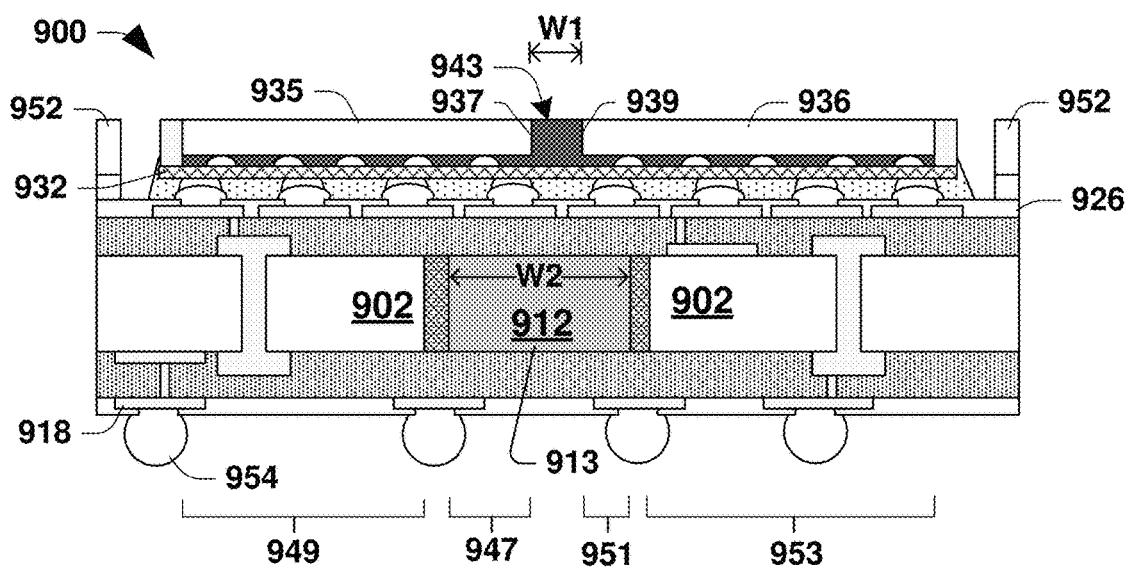

Referring to FIG. 23, according to some embodiments the multi-chip device 900 comprises a ring attachment 952 coupled to the one or more layers of resin 926. According to some embodiments, the ring attachment 952 is a stiffener that increases a rigidity of the multi-chip device 900. According to some embodiments, solder balls 954 are coupled to at least one of the one or more metal layers 918. A ball grid array may comprise the solder balls 954 and may be coupled to an electronic device and/or other suitable device.

According to some embodiments, the first chip 935 comprises a first surface 937 and the second chip 936 comprises a second surface 939, opposite the first surface 937. The first surface 937 and the second surface 939 are separated by a gap 943 which overlies the material 913. A width W1 of the gap 943 is less than or equal to a width W2 of the material 913, such that W1 and W2 are defined as "W1≤W2." In some embodiments, a width of the gap 943 is less than or equal to approximately one millimeter.

In some embodiments, the first chip 935 overlies a first portion 947 of the material 913 and a first portion 949 of the substrate 902, and the second chip 936 overlies a second portion 951 of the material 913 and a second portion 953 of the substrate 902.

FIGS. 24-29 are illustrations of multi-chip devices, according to some embodiments. According to some embodiments, at least some of the plugs, materials, substrate, etc. discussed with respect to FIGS. 24-29 correspond to the plug 116, material 119, substrate 102, etc. discussed with respect to FIGS. 1-8. According to some embodiments, at least some of the plugs, materials, substrate, etc. discussed with respect to FIGS. 24-29 correspond to the plug 912, material 913, substrate 902, etc. discussed with respect to FIGS. 9-23.

Figure 24:
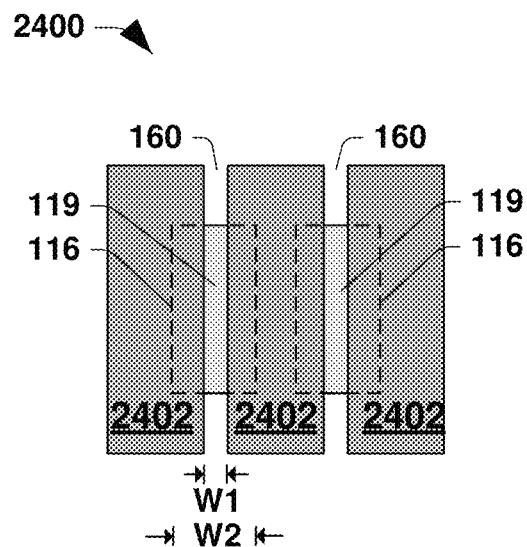
FIGS. 24-29 are illustrations of multi-chip devices and/or semiconductor packaging structures, according to some embodiments.

Referring to FIG. 24, according to some embodiments a multi-chip device 2400 comprises a plurality of chips 2402 arranged in a row direction. At least some chips of the plurality of chips 2402 are separated by gaps 160, where at least some gaps 160 have a width W1. At least a portion of at least some gaps 160 are over a plug 116, where at least some plugs 116 have a width W2, greater than width W1. The material 119 of at least some plugs 116 has a first CTE that is less than a second CTE of an underlying substrate 102 (not shown). The plugs 116 and the material 119 of the plugs 116 are within the underlying substrate 102.

Figure 25:
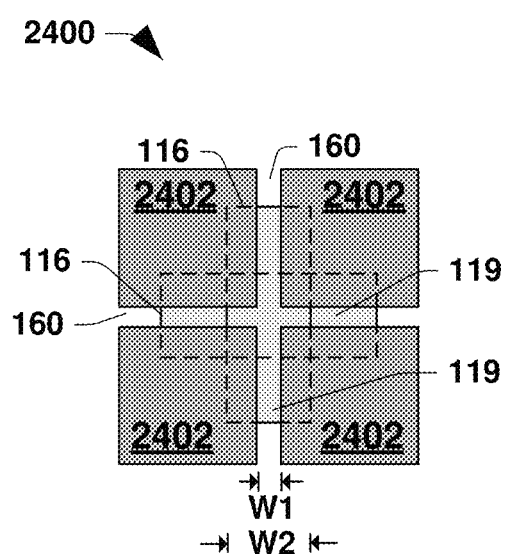

Referring to FIG. 25, according to some embodiments a multi-chip device 2400 comprises a plurality of chips 2402 arranged in a two-dimensional array. At least some chips of the plurality of chips 2402 are separated by gaps 160, where at least some gaps 160 have a width W1. At least some gaps 160 are over a plug 116, where at least some plugs 116 have a width W2, greater than width W1. The material 119 of at least some plugs 116 has a first CTE that is less than a second CTE of an underlying substrate 102 (not shown). The plugs 116 and the material 119 of the plugs 116 are within the underlying substrate 102.

Figure 26:
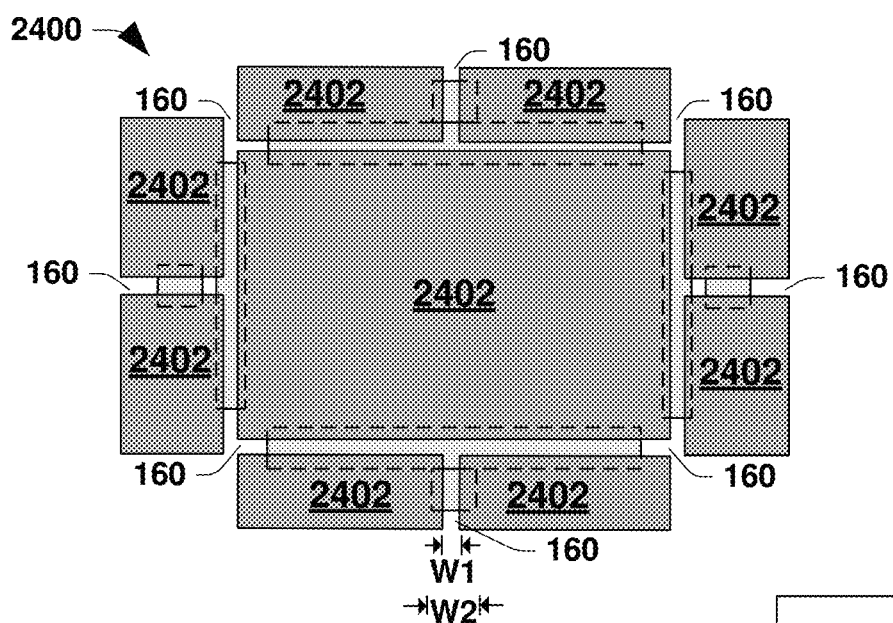

Referring to FIG. 26, according to some embodiments a multi-chip device 2400 comprises a plurality of chips 2402 arranged in a two-dimensional configuration. At least some chips of the plurality of chips 2402 are separated by gaps 160, where at least some gaps 160 have a width W1. At least some gaps 160 are over a plug 116, where at least some plugs 116 have a width W2, greater than width W1. The material 119 of at least some plugs 116 has a first CTE that is less than a second CTE of an underlying substrate 102 (not shown). The plugs 116 and the material 119 of the plugs 116 are within the underlying substrate 102.

Figure 27:
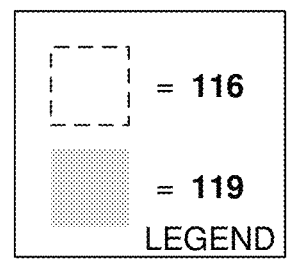
Figure 27:
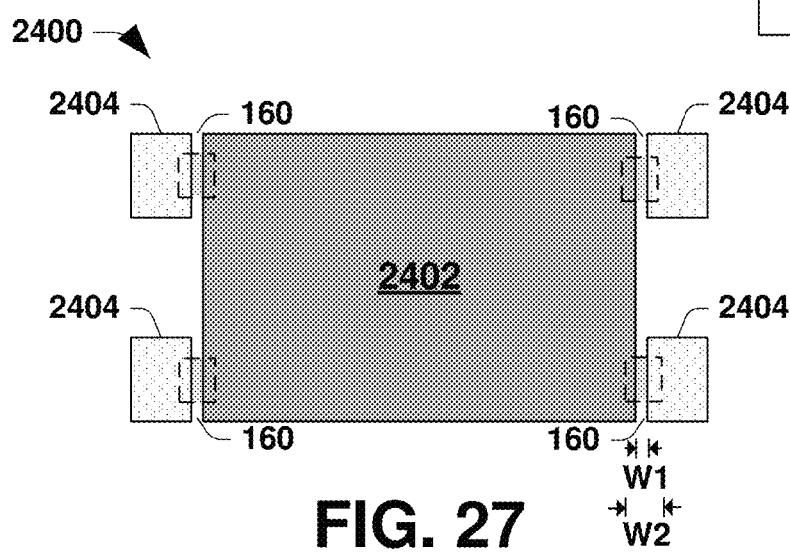

Referring to FIG. 27, according to some embodiments a multi-chip device 2400 comprises a chip 2402 coupled to solder bumps 2404. At least some solder bumps 2404 are separated from the chip by gaps 160, where at least some gaps 160 have a width W1. At least some gaps 160 are over a plug 116, where at least some plugs 116 have a width W2, greater than width W1. The material 119 of at least some plugs 116 has a first CTE that is less than a second CTE of an underlying substrate 102 (not shown). The plugs 116 and the material 119 of the plugs 116 are within the underlying substrate 102. According to some embodiments, the multi-chip device 2400 may comprise a chip scale package.

Figure 28:
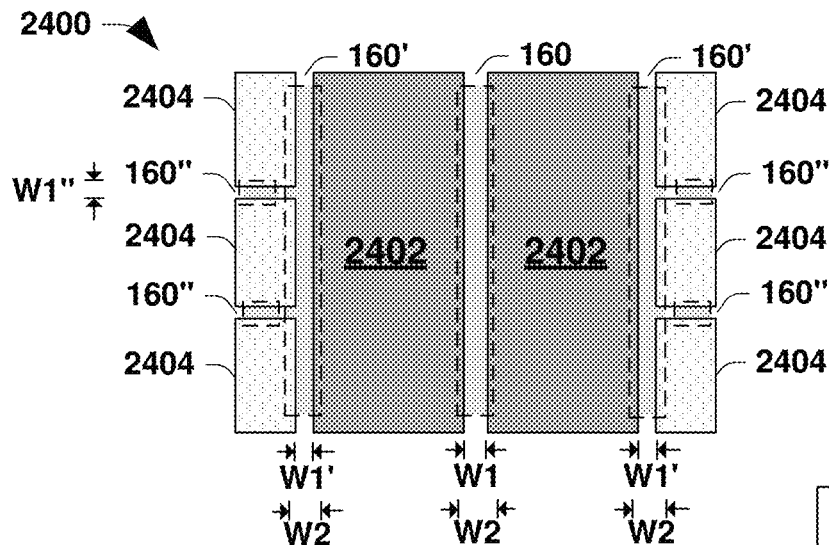

Referring to FIG. 28, according to some embodiments a multi-chip device 2400 comprises a plurality of chips 2402 coupled to solder bumps 2404. At least some of the plurality of chips 2402 are separated from one another by gaps 160, where at least some gaps 160 have a width W1. At least some solder bumps 2404 are separated from the plurality of chips 2402 by gaps 160', where at least some gaps 160' have a width W1'. At least some solder bumps 2404 are separated from one another by gaps 160", where at least some gaps 160" have a width W1". At least some gaps 160, 160' and/or 160" are over a plug 116, where at least some plugs 116 have a width W2, greater than at least one of width W1, width W1', or width W1". The material 119 of the plugs 116 has a first CTE that is less than a second CTE of an underlying substrate 102 (not shown). The plugs 116 and the material 119 of the plugs 116 are within the underlying substrate 102. According to some embodiments, the multi-chip device 2400 may comprise a chip scale package.

Figure 29:
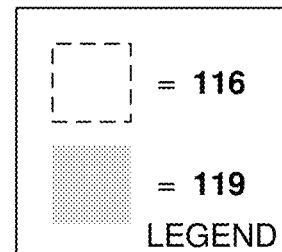
Figure 29:
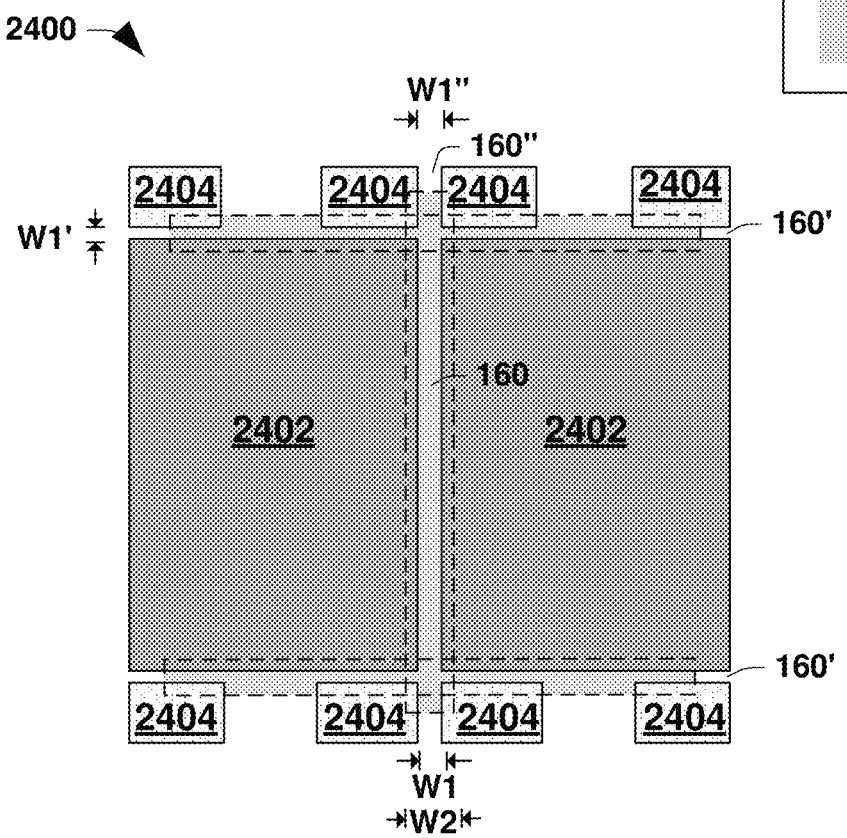

Referring to FIG. 29, according to some embodiments a multi-chip device 2400 comprises a plurality of chips 2402 coupled to solder bumps 2404. At least some of the plurality of chips 2402 are separated from one another by gap 160, where at least some gaps 160 have a width W1. At least some solder bumps 2404 are separated from the plurality of chips 2402 by gaps 160', where at least some gaps 160' have a width W1'. At least some solder bumps 2404 are separated from one another by gaps 160", where at least some gaps 160" have a width W1". At least some gaps 160, 160' and/or 160" are over a plug 116, where at least some plugs 116 have a width W2, greater than at least one of width W1, width W1', or width W1". The material 119 of the plugs 116 has a first CTE that is less than a second CTE of an underlying substrate 102 (not shown). The plugs 116 and the material 119 of the plugs 116 are within the underlying substrate 102. According to some embodiments, the multi-chip device 2400 may comprise a chip scale package.

Figure 30:
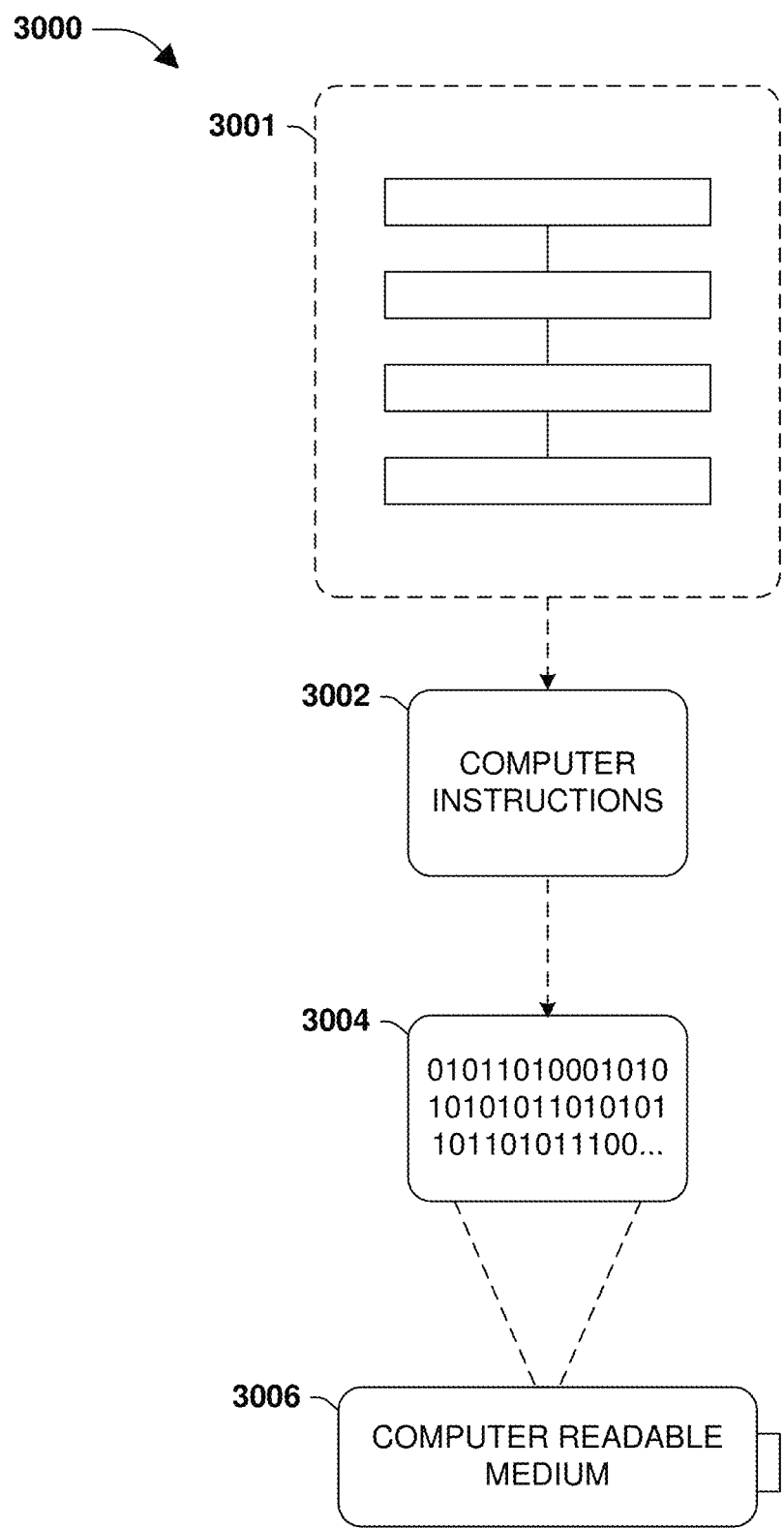
FIG. 30 is an illustration of an exemplary computer-readable medium, according to some embodiments.

FIG. 30 illustrates an exemplary computer-readable medium, according to some embodiments. One or more embodiments involve a computer-readable medium comprising processor-executable instructions configured to implement one or more of the techniques presented herein. An exemplary computer-readable medium is illustrated in FIG. 30, wherein the embodiment 3000 comprises a computer-readable medium 3006 (e.g., a CD-R, DVD-R, flash drive, a platter of a hard disk drive, etc.), on which is encoded computer-readable data 3004. This computer-readable data 3004 in turn comprises a set of processor-executable computer instructions 3002 that when executed are configured to facilitate operations according to one or more of the principles set forth herein. In some embodiments 3000, the processor-executable computer instructions 3002 are configured to facilitate performance of a method 3001, such as at least some of the aforementioned method(s). In some embodiments, the processor-executable computer instructions 3002 are configured to facilitate implementation of a system, such as at least some of the one or more aforementioned system(s). Many such computer-readable media may be devised by those of ordinary skill in the art that are configured to operate in accordance with the techniques presented herein.

Figure 31:
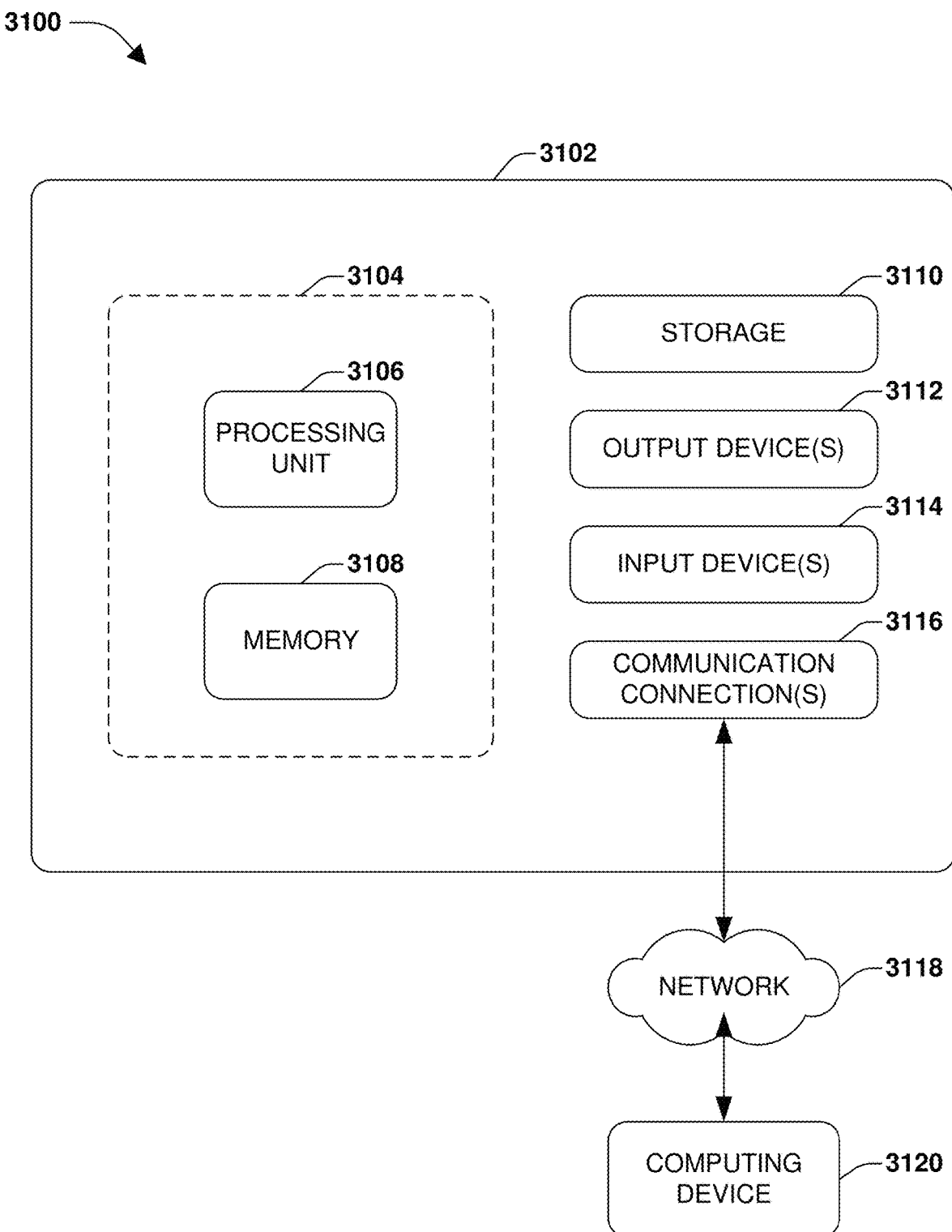
FIG. 31 illustrates an example computing environment wherein one or more of the provisions set forth herein may be implemented, according to some embodiments.

FIG. 31 illustrates an example computing environment wherein one or more of the provisions set forth herein may be implemented, according to some embodiments. FIG. 31 and the following discussion provide a brief, general description of a suitable computing environment to implement embodiments of one or more of the provisions set forth herein. The computing environment of FIG. 31 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 31 depicts an example of a system 3100 comprising a computing device 3102 configured as a controller to implement embodiments provided herein. In some configurations, computing device 3102 includes at least one processing unit 3106 and memory 3108. Depending on the exact configuration and type of computing device, memory 3108 may be volatile (such as RAM, for example), non-volatile (such as ROM, flash memory, etc., for example), or some combination of the two. This configuration is illustrated in FIG. 31 by dashed line 3104.

In some embodiments, computing device 3102 may include additional features and/or functionality. For example, computing device 3102 may also include additional storage (e.g., removable and/or non-removable) including, but not limited to, magnetic storage, optical storage, and the like. Such additional storage is illustrated in FIG. 31 by storage 3110. In some embodiments, computer readable instructions to implement one or more embodiments provided herein may be in storage 3110. Storage 3110 may also store other computer readable instructions to implement an operating system, an application program, and the like. Computer readable instructions may be loaded in memory 3108 for execution by processing unit 3106, for example.

The term "computer readable media" as used herein includes computer storage media. Computer storage media includes volatile and nonvolatile, removable and non-removable media implemented in any method or technology for storage of information such as computer readable instructions or other data. Memory 3108 and storage 3110 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 3102. Any such computer storage media may be part of computing device 3102.

Computing device 3102 may also include communication connection(s) 3116 that allows computing device 3102 to communicate with other devices. Communication connection(s) 3116 may include, but is not limited to, a modem, a Network Interface Card (NIC), an integrated network interface, a radio frequency transmitter/receiver, an infrared port, a USB connection, or other interfaces for connecting computing device 3102 to other computing devices. Communication connection(s) 3116 may include a wired connection or a wireless connection. Communication connection(s) 3116 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 3102 may include input device(s) 3114 such as keyboard, mouse, pen, voice input device, touch input device, infrared cameras, video input devices, and/or any other input device. Output device(s) 3112 such as one or more displays, speakers, printers, and/or any other output device may also be included in computing device 3102. Input device(s) 3114 and output device(s) 3112 may be connected to computing device 3102 via a wired connection, wireless connection, or any combination thereof. In some embodiments, an input device or an output device from another computing device may be used as input device(s) 3114 or output device(s) 3112 for computing device 3102.

Components of computing device 3102 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 3102 may be interconnected by a network. For example, memory 3108 may be comprised of multiple physical memory units located in different physical locations interconnected by a network.

Those skilled in the art will realize that storage devices utilized to store computer readable instructions may be distributed across a network. For example, a computing device 3120 accessible via a network 3118 may store computer readable instructions to implement one or more embodiments provided herein. Computing device 3102 may access computing device 3120 and download a part or all of the computer readable instructions for execution. Alternatively, computing device 3102 may download pieces of the computer readable instructions, as needed, or some instructions may be executed at computing device 3102 and some at computing device 3120.

As disclosed, the multi-chip device 100/900 reduces the stress on conductive traces that electrically couple chips, such as the first chip 140/935 and the second chip 142/936, together. The multi-chip device 100/900 may be implemented by replacing a portion of the material of the substrate 102/902 having the first CTE with the material 119/913 having the second CTE, less than the first CTE. The material of the substrate 102/902 is replaced by the material 119/913 in the area of the substrate 102/902 that underlies conductive traces that underlie the gap 160/943 between two chips of the multi-chip device. The material 119/913 reduces expansion and warpage of the substrate 102/902 in the presence of a heat source compared to the expansion and warpage of the substrate 102/902 of the material of the substrate 102/902 in the presence of a heat source. By reducing expansion and warpage of the substrate 102/902 in the presence of a heat source, stress on conductive traces within the redistribution layer 126/932 is reduced. Reducing stress on the conductive traces reduces the potential for cracks forming in and/or breakage of the conductive traces. Reducing the potential for cracks forming in and/or breakage of the conductive traces increases the reliability of the multi-chip device 100/900 and improves the yield of multi-chip devices, including fan-out multi-chip devices.

According to some embodiments a multi-chip device includes a first material within a substrate. The first material has a first coefficient of thermal expansion different than a second coefficient of thermal expansion of the substrate. A first chip overlies a first portion of the first material and a first portion of the substrate. A second chip overlies a second portion of the first material and a second portion of the substrate. The first material is between the first portion of the substrate and the second portion of the substrate.

According to some embodiments a semiconductor packaging structure to electrically couple a first chip to a second chip includes a first material embedded within a substrate. The first material is different than a second material of the substrate. A redistribution layer overlies the substrate. A first surface of the first chip and a second surface of the second chip are separated by a gap that overlies the first material. A first portion of the first material and a first portion of the substrate underlie the first chip. A second portion of the first material and a second portion of the substrate underlie the second chip. The redistribution layer is electrically coupled to the first chip and the second chip.

According to some embodiments a method to form a multi-chip device includes forming an opening in a substrate and filling the opening with a first material. The first material is different than a second material of the substrate. A first chip is mounted over the substrate, and a second chip is mounted over the substrate. The first material underlies a gap between the first chip and the second chip, and a width of the gap is less than a width of the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A multi-chip device, comprising:
   a substrate;
   a plug between a first sidewall of the substrate and a second sidewall of the substrate; and
   an adhesive material between the substrate and the plug to bond the plug to the first sidewall of the substrate and the second sidewall of the substrate.

2. The multi-chip device of claim 1, wherein the plug has a first coefficient of thermal expansion different than a second coefficient of thermal expansion of the substrate.

3. The multi-chip device of claim 2, wherein the first coefficient of thermal expansion is less than the second coefficient of thermal expansion.

4. The multi-chip device of claim 1, wherein a top surface of the plug is co-planar with a top surface of the substrate.

5. The multi-chip device of claim 4, wherein a bottom surface of the plug is co-planar with a bottom surface of the substrate.

6. The multi-chip device of claim 1, wherein a bottom surface of the plug is co-planar with a bottom surface of the substrate.

7. The multi-chip device of claim 1, comprising:
   a first chip overlying the plug and the substrate.

8. The multi-chip device of claim 1, comprising:
   a first chip overlying a first portion of the plug and a first portion of the substrate; and
   a second chip overlying a second portion of the plug and a second portion of the substrate.

9. The multi-chip device of claim 8, comprising:
   an underfill disposed between the first chip and the second chip.

10. The multi-chip device of claim 9, wherein the underfill overlies the plug.

11. The multi-chip device of claim 1, wherein the plug comprises a ceramic.

12. A multi-chip device, comprising:
    a substrate;
    a plug, wherein:
       a first sidewall of the plug faces a first sidewall of the substrate, and
       a second sidewall of the plug opposite the first sidewall of the plug faces a second sidewall of the substrate;

a first chip overlying the first sidewall of the plug and the first sidewall of the substrate; and a second chip overlying the second sidewall of the plug and the second sidewall of the substrate.

13. The multi-chip device of claim 12, comprising:

an underfill disposed between the first chip and the second chip and overlying the plug.

14. The multi-chip device of claim 12, wherein the plug comprises a ceramic.

15. The multi-chip device of claim 12, wherein the plug has a first coefficient of thermal expansion less than a second coefficient of thermal expansion of the substrate.

16. The multi-chip device of claim 12, comprising a solder structure between the plug and the first chip.

17. A method to form a multi-chip device, comprising:

forming an opening in a substrate;

applying a pre-formed plug in the opening; and mounting a first chip over the pre-formed plug, wherein the first chip overlies a first portion of the substrate and a first portion of the pre-formed plug.

18. The method of claim 17, comprising:

mounting a second chip over the pre-formed plug, wherein the second chip overlies a second portion of the substrate and a second portion of the pre-formed plug.

19. The method of claim 17, comprising:

forming an adhesive material in the opening before applying the pre-formed plug.

20. The method of claim 17, wherein:

a covering is disposed under the substrate and is exposed through the opening, and the method comprises removing the covering after applying the pre-formed plug in the opening.

\* \* \* \* \*